United States Patent
Coolbaugh et al.

(10) Patent No.: US 6,936,509 B2
(45) Date of Patent: Aug. 30, 2005

(54) STI PULL-DOWN TO CONTROL SIGE FACET GROWTH

(75) Inventors: Douglas Duane Coolbaugh, Essex Junction, VT (US); Mark D. Dupuis, South Burilington, VT (US); Matthew D. Gallagher, Burlington, VT (US); Peter J. Geiss, Underhill, VT (US); Brett A. Philips, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/665,713

(22) Filed: Sep. 19, 2003

(65) Prior Publication Data

US 2004/0063273 A1 Apr. 1, 2004

Related U.S. Application Data

(62) Division of application No. 09/769,640, filed on Jan. 25, 2001, now Pat. No. 6,674,102.

(51) Int. Cl.[7] .......................................... H01L 21/8249
(52) U.S. Cl. ..................... 438/235; 438/312; 438/318
(58) Field of Search ................................ 438/235, 309, 438/312, 318; 257/197, 565, 205, 423, 474

(56) References Cited

U.S. PATENT DOCUMENTS

| | | | | |
|---|---|---|---|---|
| 4,165,516 A | * | 8/1979 | Smulders .................... | 257/517 |
| 4,861,393 A | | 8/1989 | Bean et al. | |
| 4,887,145 A | | 12/1989 | Washio et al. | |
| 5,120,394 A | | 6/1992 | Mukai | |
| 5,399,511 A | * | 3/1995 | Taka et al. .................. | 438/311 |
| 5,506,427 A | | 4/1996 | Imai | |
| 5,587,327 A | | 12/1996 | Konig et al. | |
| 5,633,179 A | * | 5/1997 | Kamins et al. ............. | 438/318 |
| 5,821,149 A | * | 10/1998 | Schuppen et al. .......... | 438/312 |
| 5,846,869 A | * | 12/1998 | Hashimoto et al. ......... | 438/365 |
| 5,861,640 A | | 1/1999 | Gomi | |
| 5,955,745 A | | 9/1999 | Yamazaki | |
| 5,962,880 A | * | 10/1999 | Oda et al. ................... | 257/198 |
| 6,303,419 B1 | | 10/2001 | Chang et al. | |
| 6,352,907 B1 | * | 3/2002 | Gris ........................... | 438/438 |
| 6,388,307 B1 | * | 5/2002 | Kondo et al. ............... | 257/592 |
| 6,417,058 B1 | * | 7/2002 | Richardson et al. ........ | 438/312 |
| 6,489,211 B1 | * | 12/2002 | Freeman et al. ............ | 438/322 |
| 6,506,657 B1 | * | 1/2003 | Essaian ...................... | 438/318 |
| 6,509,242 B2 | * | 1/2003 | Frei et al. ................... | 438/312 |
| 6,680,522 B1 | * | 1/2004 | Sato ........................... | 257/588 |
| 2002/0158309 A1 | * | 10/2002 | Swanson et al. ............ | 257/565 |

FOREIGN PATENT DOCUMENTS

| | | | |
|---|---|---|---|
| DE | 19652423 | * | 6/1998 |
| JP | 61-31387 | * | 2/1986 |
| JP | 1984000152265 | | 2/1986 |
| JP | 61-230374 | * | 10/1986 |
| JP | 1985000072889 | | 10/1986 |
| JP | 6-69434 | * | 3/1994 |
| JP | 1922000238930 | | 3/1994 |
| JP | 2000-269230 | * | 9/2000 |
| KR | 2001-009810 | * | 7/1999 |

* cited by examiner

*Primary Examiner*—Nathan J. Flynn
*Assistant Examiner*—Ahmed N. Sefer
(74) *Attorney, Agent, or Firm*—Scully, Scott, Murphy & Presser; William D. Sabo, Esq.

(57) ABSTRACT

A SiGe bipolar transistor including a semiconductor substrate having a collector and sub-collector region formed therein, wherein the collector and sub-collector are formed between isolation regions that are also present in the substrate is provided. Each isolation region includes a recessed surface and a non-recessed surface which are formed utilizing lithography and etching. A SiGe layer is formed on the substrate as well as the recessed non-recessed surfaces of each isolation region, the SiGe layer includes polycrystalline Si regions and a SiGe base region. A patterned insulator layer is formed on the SiGe base region; and an emitter is formed on the patterned insulator layer and in contact with the SiGe base region through an emitter window opening.

10 Claims, 4 Drawing Sheets

STI PULL-DOWN TO CONTROL SIGE FACET GROWTH

RELATED APPLICATION

This application is a divisional of U.S. application Ser. No. 09/769,640, filed Jan. 25, 2001 now U.S. Pat. No. 6,674,102.

FIELD OF THE INVENTION

The present invention relates to heterojunction bipolar transistors, and more particularly to a method of fabricating a SiGe heterojunction bipolar transistor wherein the base resistance is improved by employing an etching process that controls facet growth at the edges of the SiGe layer. Specifically, the present invention controls the facet growth by providing a recessed area in isolation regions that are present in the structure.

BACKGROUND OF THE INVENTION

Significant growth in both high-frequency wired and wireless markets has introduced new opportunities where compound semiconductors such as SiGe have unique advantages over bulk complementary metal oxide semiconductor (CMOS) technology. With the rapid advancement of epitaxial-layer pseudomorphic SiGe deposition processes, epitaxial-base SiGe heterojunction bipolar transistors have been integrated with mainstream advanced CMOS development for wide market acceptance, providing the advantages of SiGe technology for analog and RF circuitry while maintaining the full utilization of the advanced CMOS technology base for digital logic circuitry.

A typical prior art SiGe heterojunction bipolar transistor is shown, for example, in FIG. 1. Specifically, the SiGe heterojunction bipolar transistor shown in FIG. 1 comprises semiconductor substrate 10 of a first conductivity type having sub-collector 14 and collector 16 formed therein. Isolation regions 12, which are also present in the substrate, define the outer boundaries of the bipolar transistor. The bipolar transistor of FIG. 1 further includes SiGe layer 20 formed on a surface of substrate 10 as well as isolation regions 12. The SiGe layer includes polycrystalline Si regions 24 that are formed over the isolation regions and SiGe base region 22 that is formed over the collector and sub-collector regions. The prior art bipolar transistor also includes patterned insulator layer 26 formed on the base region and emitter 28 formed on the patterned insulator layer as well as a surface of SiGe base region 22.

A major problem with prior art SiGe heterojunction bipolar transistors of the type illustrated in FIG. 1 is that during the deposition of the SiGe layer, facet regions (labeled as 30 in FIG. 1) grow at the edges of the SiGe layer between the polycrystalline Si region and the SiGe base region. As shown, the facets form in regions which encroach upon the corner formed between the upper surfaces of substrate 10 and the isolation regions of the structure. The growth of facets near the this corner leads to increased parasitic current leakage as well as shorts which are caused by the presence of excessive dislocations in the structure. Moreover, the presence of facets in a bipolar transistor increases the base resistance of the structure.

In view of the above mentioned problems with prior art heterojunction bipolar transistors, there is still a continued need for developing a new and improved method which is capable of fabricating a heterojunction bipolar transistor in which facet growth is controlled such that the structure will have reduced dislocations and base resistance as well as diminished parasitic leakage.

SUMMARY OF THE INVENTION

One object of the present invention is to provide a method of fabricating a SiGe heterojunction bipolar transistor wherein the SiGe base resistance is reduced.

Another object of the present invention is to provide a method of fabricating a SiGe heterojunction bipolar transistor in which facet growth is controlled such that facets do not form at the corners that exist between the upper surfaces of the substrate and the isolation regions.

A further object of the present invention is to provide a method of fabricating a SiGe heterojunction bipolar transistor in which diminished parasitic current leakage is achieved.

These and other objects and advantages are achieved in the present invention by forming a pull-down isolation region. The pull-down isolation region is formed in the present invention by recessing a portion of the isolation region prior to forming the SiGe layer on the structure. During SiGe deposition, the facets do not encroach upon the corner that exists between upper surfaces of the substrate and the pull-down isolation region.

Specifically, the method of the present invention comprises the steps of:

(a) providing a semiconductor substrate having isolation regions formed therein, said semiconductor substrate having an upper surface;

(b) recessing a portion of the isolation regions below the upper surface of said semiconductor substrate so as to provide a recessed isolation surface; and (c) forming a SiGe layer on the upper surface of the semiconductor substrate as well as the recessed isolation surface, wherein said recessing controls facet growth at edges of the SiGe layer thereby reducing dislocations therein.

After conducting steps (a)–(c) above, conventional processing steps can be employed to form the emitter region of the bipolar transistor.

In one embodiment of the present invention, a dielectric layer such as a nitride is formed on portions of the isolation regions which are not recessed prior to formation of the SiGe layer. In addition to being formed on the non-recessed surfaces of the isolation regions, it is contemplated in the present invention to use the dielectric as an etch mask in making the pull-down isolation regions. When this embodiment is employed, a patterned dielectric is formed on portions of the isolation regions prior to recessing, and an etching process that is highly selective in removing the isolation fill material as compared to the dielectric may be employed.

Another aspect of the present invention relates to a SiGe heterojunction bipolar transistor which includes pull-down isolation regions formed therein. Specifically, the inventive SiGe bipolar transistor comprises:

a semiconductor substrate having a collector and sub-collector formed therein, wherein said collector is formed between isolation regions that are also present in the substrate, each of said isolation regions having a recessed surface and a non-recessed surface;

a SiGe layer formed on said substrate as well as said recessed and non-recessed surfaces of each isolation region, said SiGe layer including polycrystalline Si regions and a SiGe base region;

a patterned insulator layer formed on said SiGe base region, said patterned insulator layer having an opening therein; and an emitter formed on said patterned insulator layer and in contact with said SiGe base region through said opening.

In one embodiment of the present invention, the inventive SiGe heterojunction bipolar transistor includes a patterned dielectric material which is present on the non-recessed surface of the isolation regions.

DETAILED DESCRIPTION OF THE INVENTION

Figure 1:
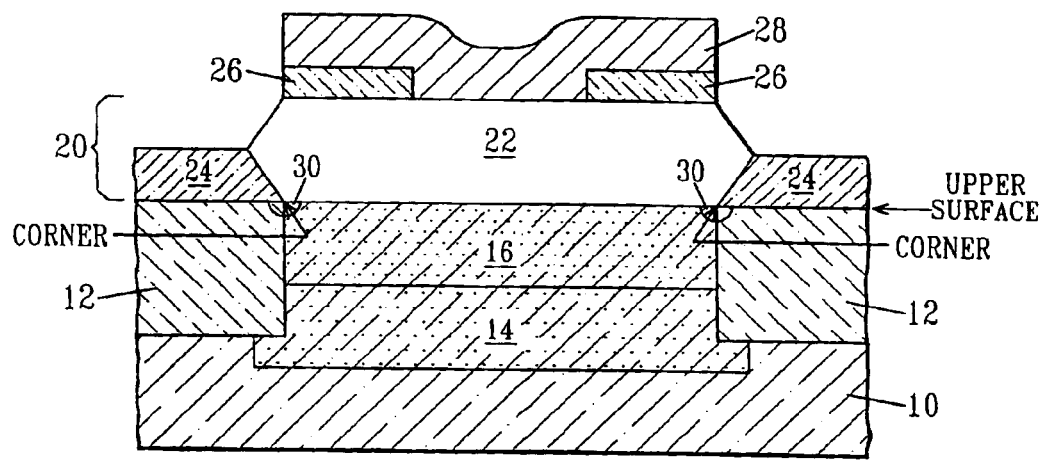
FIG. 1 is a pictorial representation of a prior art SiGe heterojunction bipolar transistor wherein conventional isolation regions are employed.

The present invention which provides a method for improving the SiGe bipolar yield of a SiGe bipolar transistor will now be described in more detail by referring to the drawings the accompany the present invention. It is noted that in the accompanying drawings, like and corresponding elements are referred to by like reference numerals. Also, for simplicity, only one bipolar device region is shown in the drawings. Other bipolar device regions as well as digital logic circuitry may be formed adjacent to the bipolar device region depicted in the drawings.

Figure 2:
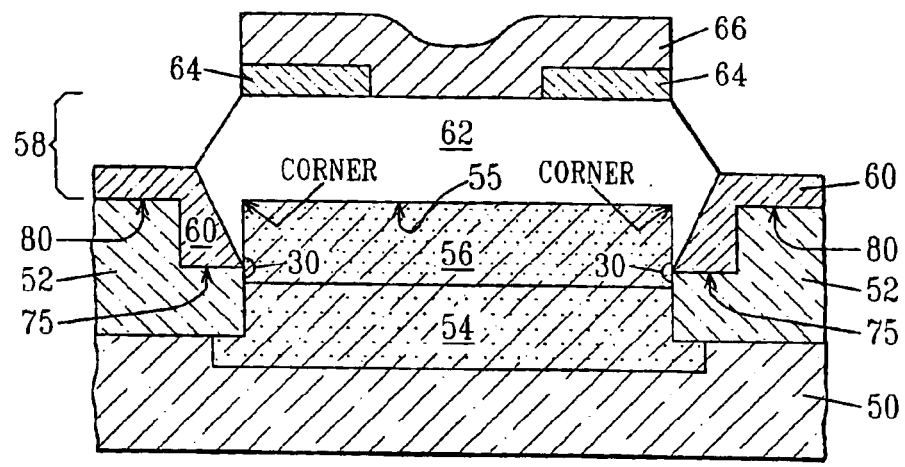
FIG. 2 is a pictorial representation of the inventive SiGe heterojunction bipolar transistor wherein pull-down isolation regions having a recessed surface and a non-recessed surface are employed.

Reference is first made to FIG. 2 which represents a cross-sectional view of the inventive SiGe heterojunction bipolar transistor. Specifically, the SiGe heterojunction bipolar transistor comprises semiconductor substrate 50 of a first conductivity type (N or P) having sub-collector region 54 and collector region 56 formed therein. The substrate is further characterized as having an upper surface 55. Isolation regions 52 which are also present in the substrate define the outer boundaries of the bipolar device region and serve to isolate the bipolar device region shown in FIG. 2 from adjacent device regions.

The isolation regions of the present invention (which are sometimes referred to herein as "pull-down" isolation regions) are unlike typical isolation regions of the prior art in that the inventive isolation regions include recessed surfaces and non-recessed surfaces. In FIG. 2, reference numeral 75 refers to the recessed surface of the isolation regions and reference numeral 80 refers to the non-recessed surface of the isolation region. The recessed surface is below the corner in the upper surface of the substrate.

The SiGe bipolar transistor of FIG. 2 also includes SiGe layer 58 formed on substrate 50 as well as isolation regions 52, i.e., on recessed surface 75 and non-recessed surface 80. In accordance with the present invention, the SiGe layer includes polycrystalline Si regions 60 that are formed predominately over isolation regions 52 and SiGe base region 62 which is formed predominately over the collector and sub-collector regions. The SiGe base region includes extrinsic base and intrinsic regions; these regions are not separately labeled in the drawings, but are nevertheless meant to be included within region 62. It is noted that the extrinsic and intrinsic base regions of the structure are sometimes referred to as the pedestal portion of a bipolar transistor device.

The bipolar transistor of FIG. 2 also comprises a patterned insulator layer 64 which has an opening formed therein and an emitter, i.e., a region of intrinsic polysilicon, 66 formed on said patterned insulator layer and in contact with the SiGe base region through the opening in the patterned insulator layer.

It is noted that the bipolar transistor shown in FIG. 2 has improved SiGe bipolar yield because of the presence of the pull-down isolation regions which substantially reduce the facet (30) growth at the edges of the SiGe layer. The inventive pull-down isolation regions reduce dislocations (which ultimately may lead to bipolar shorts) that typically occur in prior art SiGe heterojunction bipolar transistors.

Figure 3:
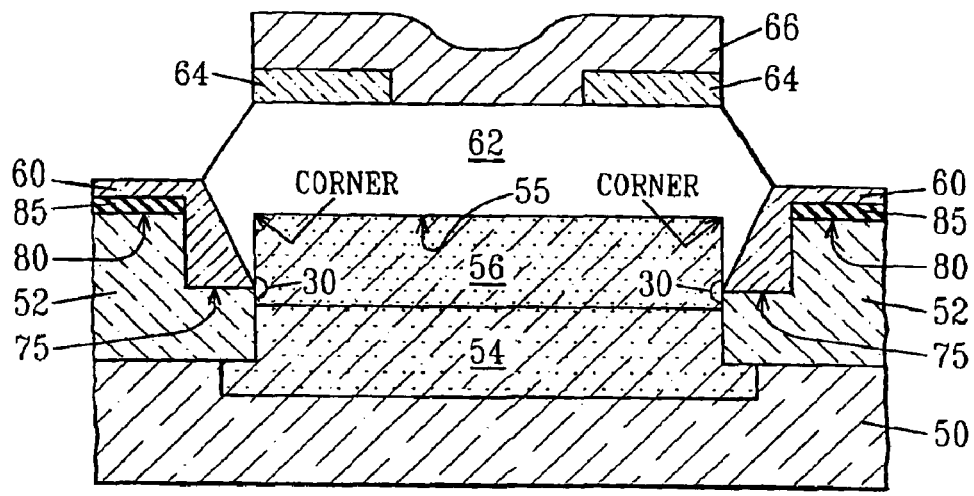
FIG. 3 shows an alternative embodiment of the present invention wherein a dielectric is formed on the non-recessed surface of the isolation region.

FIG. 3 shows an alternative SiGe heterojunction bipolar transistor that can be formed in the present invention. The alternative SiGe bipolar transistor includes the same elements as that shown in FIG. 2 except for dielectric layer 85 which is formed on non-recessed isolation surfaces 80.

Figure 4:
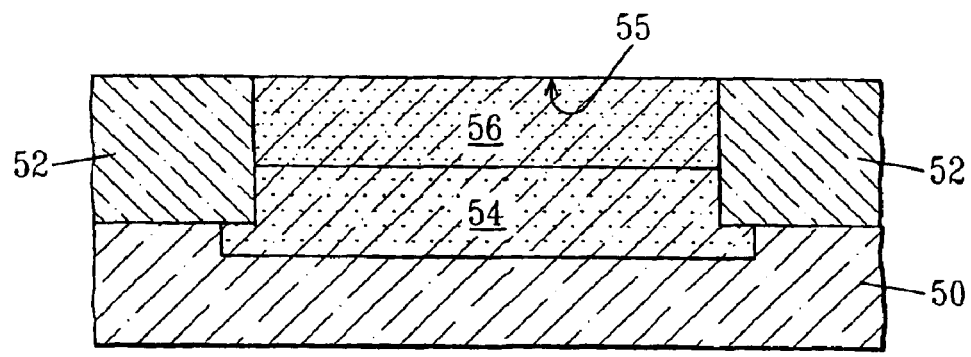
FIGS. 4–8 are pictorial representations of the various processing steps employed in the present invention in forming the inventive SiGe heterojunction bipolar transistor.

The method and various materials that are employed in forming the SiGe heterojunction bipolar transistors shown in FIGS. 2–3 will now be described hereinbelow in more detail. Reference is first made to FIG. 4 which shows the bipolar device region of an initial structure that is employed in the present invention. The initial structure shown in FIG. 4 comprises substrate 50 having sub-collector region 54, collector region 56 and isolation regions 52 formed therein.

The structure shown in FIG. 4 is fabricated using conventional processing steps that are well known to those skilled in the art. Moreover, conventional materials are used in fabricating the same. For example, substrate 50 is composed of any semiconducting material including, but not limited to: Si, Ge, SiGe, GaAs, InAs, InP and all other III/V compound semiconductors. Layered substrates comprising the same or different semiconducting material, e.g., Si/Si or Si/SiGe, are also contemplated herein. Of these semiconducting materials, it is preferred that substrate 50 be composed of Si. As mentioned above, the substrate may be a N-type substrate or a P-type substrate depending on the type of device to be subsequently formed.

The structure of FIG. 4 is formed by first forming an oxide layer (not shown) on the surface of substrate 50 using a conventional deposition process such as chemical vapor deposition (CVD), plasma-assisted CVD, or sputtering, or alternatively the oxide layer is grown thermally. Sub-collector region 54 is then formed in the substrate using a conventional ion implantation step. After the implantation step, a thick oxide (also not shown), on the order of about 240 nm, is grown on the surface to eliminate implantation damage. Next, the thick oxide as well as the previously mentioned oxide layer are removed utilizing an etching process which has a high selectivity for removing oxide as compared to silicon.

Isolation regions 52 are then formed by either using a conventional local oxidation of silicon (LOCOS) process or by utilizing lithography, etching and trench isolation filling. It is noted that the drawings show the formation of isolation trench regions which are formed as follows: A patterned masking layer (not shown) is first formed on the surface of substrate 50 exposing portions of the substrate. Isolation trenches are then etched into the exposed portions of the substrate utilizing a conventional dry etching process such as reactive-ion etching (RIE) or plasma-etching. The trenches thus formed may be optionally lined with a conventional liner material, i.e., an oxide, and thereafter CVD or another like deposition process is employed to fill the trenches with $SiO_2$ or another like trench dielectric material. The trench dielectric material may optionally be densified after deposition and a conventional planarization process such as chemical-mechanical polishing (CMP) may also be optionally employed.

Following the formation of isolation regions in the substrate, collector region 56 is then formed in the bipolar device region utilizing conventional ion implantation and activation annealing processes that are well known to those skilled in the art. The activation annealing process is typically carried out at a temperature of about 950° C. or above for a time of about 30 seconds or less.

At this point of the inventive process, the bipolar device region shown in the drawings may be protected by forming a protective material such as $Si_3N_4$ thereon, and conventional processing steps which are capable of forming adjacent device regions can be performed. After completion of the adjacent device regions and subsequent protection thereof, the inventive process continues. It should be noted that in some embodiments, the adjacent device regions are formed after completely fabricating the bipolar transistor.

Figure 5:
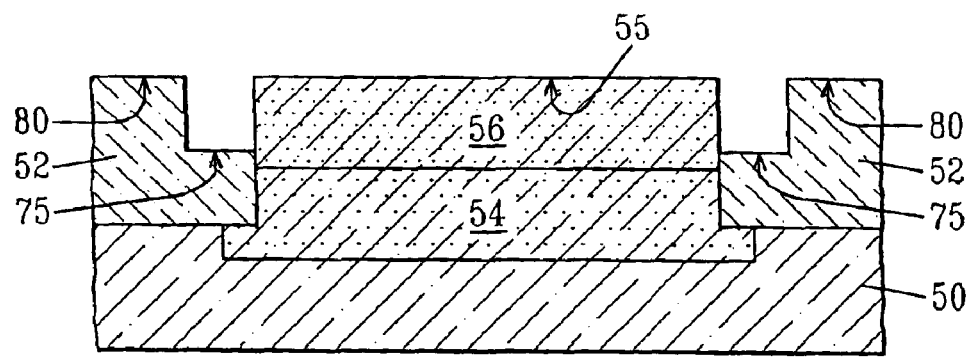

Next, and as shown in FIG. 5, isolation regions are recessed utilizing conventional lithography and etching so as to provide isolation regions that contain a recessed portion and a non-recessed portion. The recessed portion of the isolation regions contains a recessed surface 75 which is formed below upper surface 55 of the substrate. Moreover, the non-recessed portion of the isolation regions contains non-recessed surface 85 which is substantially planar with the upper surface of the substrate. The etching step is carried out utilizing any isotropic etching process such as reactive-ion etching (RIE), plasma etching and ion beam etching. It is noted that facets 30 do not form in the corner region, as is the case shown in FIG. 1.

Figure 6:
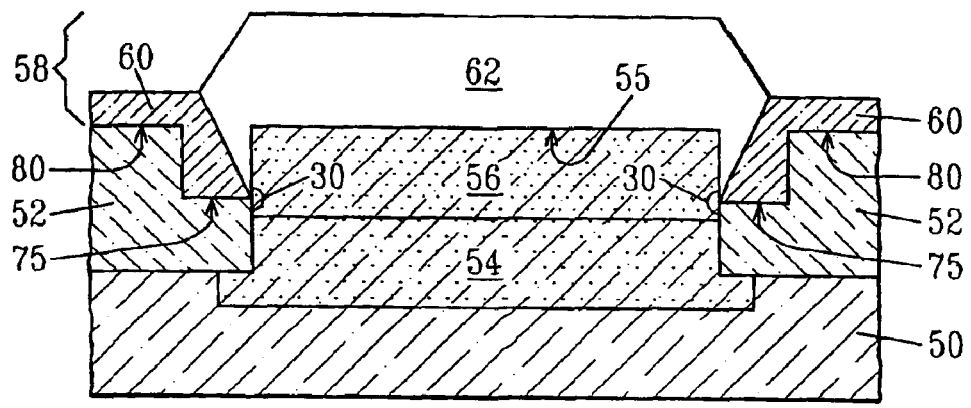

The next step of the present invention is shown in FIG. 6. In this figure, SiGe layer 58 is formed on substrate 50 as well as isolation regions 52 (i.e., recessed and non-recessed surfaces). In accordance with the present invention, the SiGe layer includes polycrystalline Si regions 60 that are formed predominately over isolation regions 52, and SiGe base region 62 which is formed predominately over the collector and sub-collector regions.

The SiGe layer is formed epitaxially utilizing any conventional deposition technique including, but not limited to: ultra-high vacuum chemical vapor deposition (UHVCVD), molecular beam epitaxy (MBE), rapid thermal chemical vapor deposition (RTCVD) and plasma-enhanced chemical vapor deposition (PECVD). The conditions used in forming the SiGe layer (which are conventional and well known to those skilled in the art) vary depending upon the desired technique employed. It should be noted that during the deposition of the SiGe layer, facets begin to grow between the edges of the SiGe base regions and the Si polycrystalline region. In the present invention, facet growth is controlled by the pull-down isolation regions to such a degree that substantially no dislocations are present therein.

Figure 7:
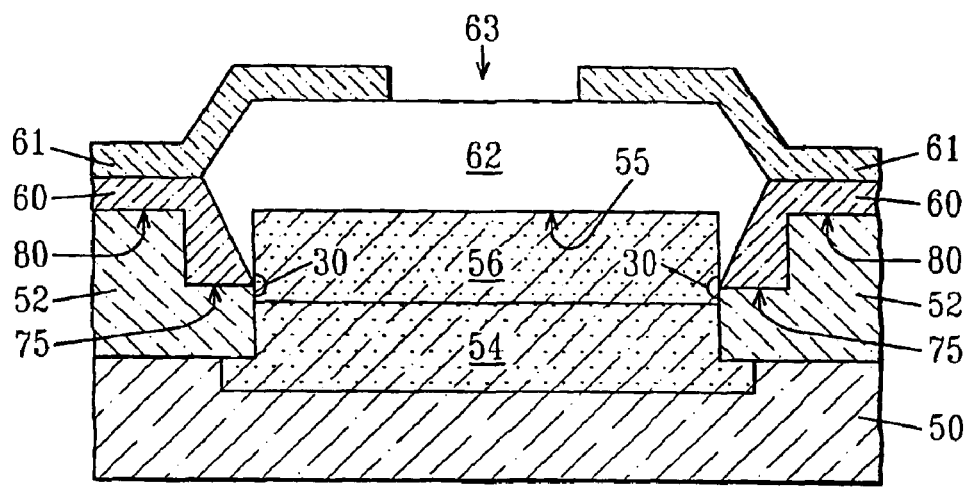

Next, and as shown in FIG. 7, insulator layer 61 (which will subsequently become patterned insulator 64) is formed on SiGe layer 58 utilizing a conventional deposition process such as CVD, plasma-assisted CVD, chemical solution deposition and other like deposition processes. The insulator may be a single layer, as is shown in FIG. 7, or it may contain multi-insulator layers. The insulator layer is composed of the same or different insulator material which is selected from the group consisting of $SiO_2$, Si oxynitride and other like insulators.

Emitter window opening 63 (See, FIG. 7 as well) is then formed in insulator layer 61 so as to expose a portion of the SiGe base region. The emitter window opening is formed utilizing conventional lithography and etching. The etching step used is selective in removing the insulator material as compared to the SiGe layer.

Figure 8:
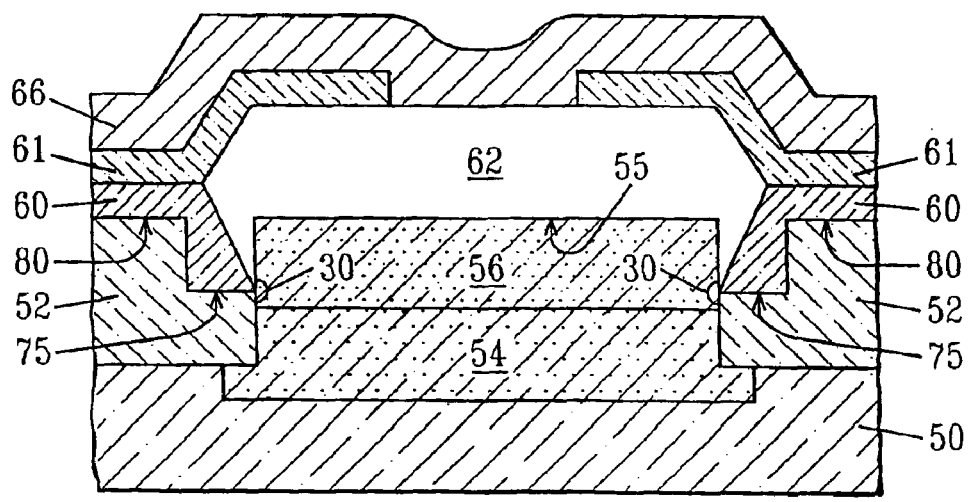

Following formation of the emitter window opening, an intrinsic polysilicon layer (which will subsequently become emitter 66) is formed on the patterned insulator and in the emitter window opening by utilizing either a conventional in-situ doping deposition process or deposition followed by ion implantation, See FIG. 8. The polysilicon and the insulator are then selectively removed so as to form patterned insulator 64 and emitter 66 on SiGe base region 62 providing the structure shown in FIG. 2. Specifically, conventional lithography and etching are employed in forming the final structure shown in FIG. 2. It is should be noted that a single etching process may be employed in removing portions of the intrinsic polysilicon layer and insulator layer 61, or separate etching steps may be employed in removing these layers.

Figure 9:
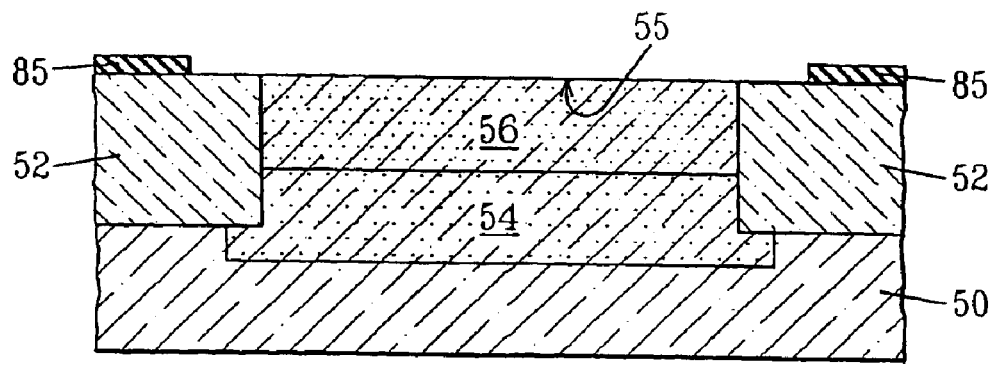
FIGS. 9–10 are pictorial representations of an embodiment of the present invention wherein a patterned dielectric is used as an etch mask.
Figure 10:
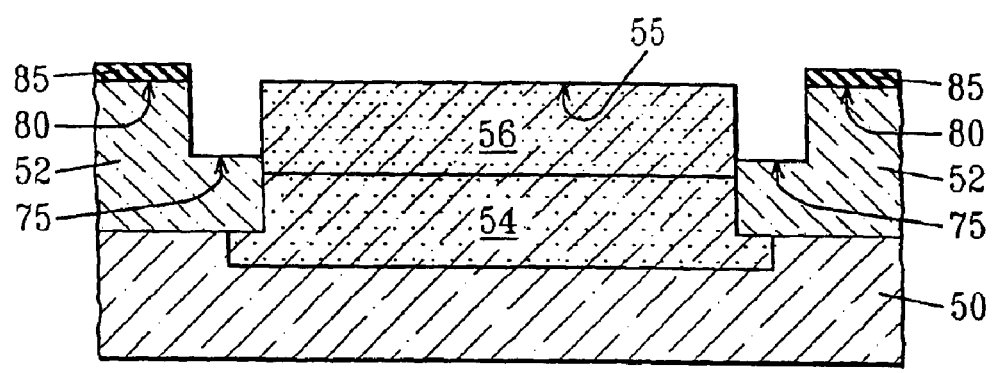

In the case of the alternative structure shown in FIG. 3, the same process steps as mentioned above are employed except that dielectric 85 is formed on the non-recessed surface of the isolation regions prior to formation of the SiGe layer. The dielectric layer may be composed of an oxide, a nitride, an oxynitride or any combination thereof, with preference given to nitride dielectrics. The dielectric is formed utilizing conventional deposition and, if necessary, lithography and etching may be employed in patterning the same. In addition to being formed on the non-recessed surface of the isolation regions, it is contemplated in the present invention to use the dielectric as an etch mask in making the recessed pull-down isolation regions. When this embodiment is employed, a pattered dielectric is formed on portions of the isolation regions (See FIG. 9), and an etching process that is highly selective in removing the isolation fill material as compared to the dielectric may be employed (See FIG. 10).

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A method of reducing the dislocations present in a SiGe heterojunction bipolar transistor, said method comprising:
   (a) providing a semiconductor substrate comprising a collector region located at an upper surface of said semiconductor substrate and isolation regions adjacent said collector region, said collector region and said isolation regions are located within said semiconductor substrate;
   (b) recessing a portion of the isolation regions below said upper surface of said collector region in said semiconductor substrate so as to provide a recessed isolation surface below said upper surface of the collector region in the semiconductor substrate and a non-recessed surface that is substantially planar with said upper surface of the collector region in the semiconductor substrate; and (c) forming a SiGe layer on the semiconductor substrate as well as said recessed isolation surface, wherein said recessing controls facet formation at edges at the SiGe layer and the upper surface of the collector.

2. The method of claim 1 wherein said isolation regions are trench isolation regions.

3. The method of claim 2 wherein said trench isolation regions are formed by lithography, etching and trench filling.

4. The method of claim 3 wherein said trench filling includes deposition of $SiO_2$.

5. The method of claim 1 wherein a patterned dielectric layer is formed on a portion of said isolation regions prior to conducting step (b).

6. The method of claim 5 wherein said patterned dielectric layer is composed of a nitride.

7. The method of claim 1 wherein said recessing includes lithography and etching.

8. The method of claim 1 wherein after said recessing a patterned dielectric is formed on a portion of the isolation region that is not recessed.

9. The method of claim 1 wherein said SiGe layer is formed by a deposition process selected from the group consisting of ultra-high vacuum chemical vapor deposition (UHVCVD), molecular beam epitaxy (MBE), rapid thermal chemical vapor deposition (RTCVD) and plasma-enhanced chemical vapor deposition (PECVD).

10. The method of claim 1 further comprising the steps of:

(d) forming an insulator on said SiGe layer;

(e) providing an opening in said insulator so as to expose a portion of said SiGe layer;

(f) forming an emitter material an said insulator and in said opening so as to contact said SiGe layer; and (g) patterning said emitter material and said insulator so as to form a patterned emitter and a patterned insulator on said SiGe layer.

* * * * *